(12) United States Patent
Song et al.

(10) Patent No.: US 6,852,607 B2
(45) Date of Patent: Feb. 8, 2005

(54) WAFER LEVEL PACKAGE HAVING A SIDE PACKAGE

(75) Inventors: Young Hee Song, Kyungki-Do (KR);
Ming Young Son, Kyungki-do (KR);
Woong Ky Ha, Kyungki-Do (KR)

(73) Assignee: Samsung Electronics., LTD, Suwon (KR)

(*) Notice: Subject to any disclaimer, the term of this patent is extended or adjusted under 35 U.S.C. 154(b) by 0 days.

(21) Appl. No.: 10/144,539

(22) Filed: May 10, 2002

(65) Prior Publication Data

US 2002/0180017 A1 Dec. 5, 2002

(30) Foreign Application Priority Data

May 31, 2001 (KR) ........................................ 2001-30372

(51) Int. Cl.[7] .......................................... H01L 21/301
(52) U.S. Cl. ...................................... 438/464; 438/113
(58) Field of Search ................................ 438/464, 113, 438/110

(56) References Cited

U.S. PATENT DOCUMENTS 6,107,164 A * 8/2000 Ohuchi ........................ 438/465
6,420,244 B2 * 7/2002 Lee ............................. 438/458

FOREIGN PATENT DOCUMENTS

KR    1999-0057571    7/1999

* cited by examiner

*Primary Examiner*—Douglas Wille
(74) *Attorney, Agent, or Firm*—Harness, Dickey & Pierce, PLC

(57) ABSTRACT

A method of manufacturing a wafer level package includes forming a semiconductor wafer including semiconductor chips, and forming a package body on the sides of each semiconductor chip. The package body is formed by forming a space between each semiconductor chip and potting a package material in the space, which can be a mold resin. The wafer is then separated into separate semiconductor chips by cutting through the package body.

13 Claims, 4 Drawing Sheets

WAFER LEVEL PACKAGE HAVING A SIDE PACKAGE

BACKGROUND OF THE INVENTION

The present invention relates to a semiconductor chip packaging technology, and more particularly to a wafer level package having a side package.

Semiconductor chip packages provide input and output connections to a semiconductor chip for an external device, as well as physical protection for the semiconductor chip. The wafer level package is one type of semiconductor chip package. The wafer level package is a package formed on a semiconductor wafer, rather than on a die (a "die" refers to a semiconductor chip that has been separated from the wafer). Forming a wafer level package on a wafer has the advantages of providing more complete integration of the package functions and the semiconductor chip functions, improving the thermal and electrical characteristics of the semiconductor chips, and decreasing the size of the semiconductor chip package. Additionally, since the wafer level package is formed in a single process, the price to manufacture the semiconductor chip is reduced.

However, drawbacks do exist with wafer level packaging. Most notably, the inability of the process to package all sides of the semiconductor chip. For example, with wafer level packaging, sides of individual dies are left unpackaged. A semiconductor chip not having a package body surrounding all sides of the semiconductor chip is vulnerable to physical damage, for example, from physical contact with objects of the surrounding environment during the manufacturing process, or from the handling of the semiconductor chip. Of particular concern is the damage an exposed semiconductor chip may receive during the process for wafer back lapping, which is performed to decrease the thickness of the semiconductor chip.

SUMMARY OF THE INVENTION

For these reasons, it is desirable to provide a multi-chip package comprising plural chips of various types and sizes, and to provide for chips of varying sizes to be mounted above each other.

Accordingly, one embodiment of the present invention provides a method of manufacturing a wafer level package including forming a semiconductor wafer which includes semiconductor chips, where each semiconductor chip includes a plurality of electrode pads, and forming a package body on each side of the semiconductor chip. Forming the package body includes forming a space between each semiconductor chip and providing a package material in the space, which can be a molded resin. The wafer is then separated into separate semiconductor chips by cutting through the package body.

In another embodiment of the present invention, a wafer level package is disclosed. The wafer level package includes a semiconductor chip having a plurality of electrode pads on the active surface, and a package body formed on the sides of the semiconductor chip.

With the descriptions mentioned above along with other feature and advantages, the outline will be more clearly understood from the following detailed description taken in conjunction with the accompanying illustrations. It is important to point out that the illustrations may not necessarily be drawn to scale and there may be other embodiments to this invention that are not specifically illustrated.

BRIEF DESCRIPTION OF THE DRAWINGS

The features and advantages of the present invention will become more apparent by describing in detail specific embodiments thereof with reference to the attached drawings in which.

DETAILED DESCRIPTION OF THE INVENTION

Embodiments of the present invention are described below with reference to the accompanying drawings.

Figure 1:
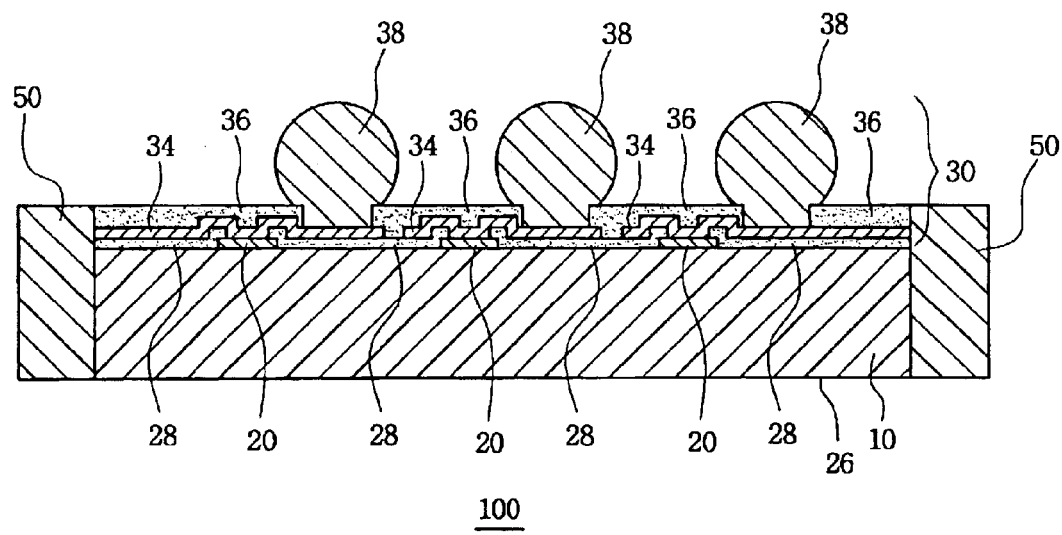
FIG. 1 is a cross sectional view taken along line I—I of FIG. 2 showing a wafer level package according to the present invention.

FIG. 1 is a cross sectional view showing a wafer level package according to the present invention.

A wafer level package 100 according to the present invention includes a semiconductor chip 10, a package pattern 30, and a package body 50 which is formed on the side surface of semiconductor chip 10. Semiconductor chip 10 includes circuit elements (not shown) which are integrated on semiconductor chip 10 by the wafer fabrication process. These circuit elements are referred to as "on-chip circuits" and are selected based on the electrical characteristics and the functions of semiconductor chip 10. Metal electrode pads 20 formed on the active surface of semiconductor chip (the top surface of semiconductor chip 10 as shown in FIG. 1) provide electrical connections to electrically connect the on-chip circuits to external devices (not shown).

Figure 3:
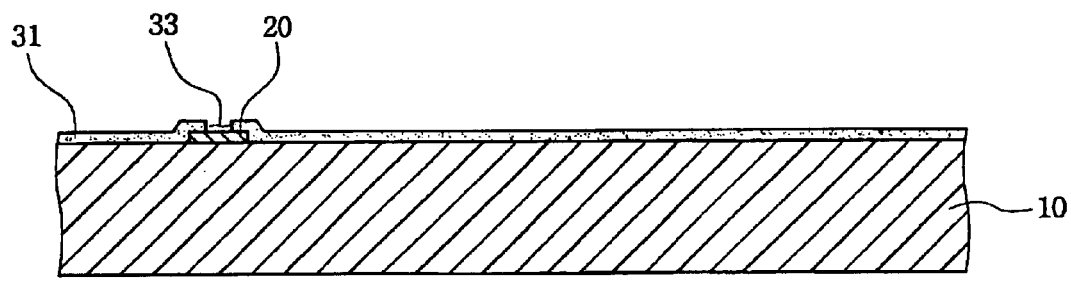
FIG. 3 illustrates the opening of electrode pads of a semiconductor chip in a method of manufacturing a wafer level package according to the present invention.
Figure 4:
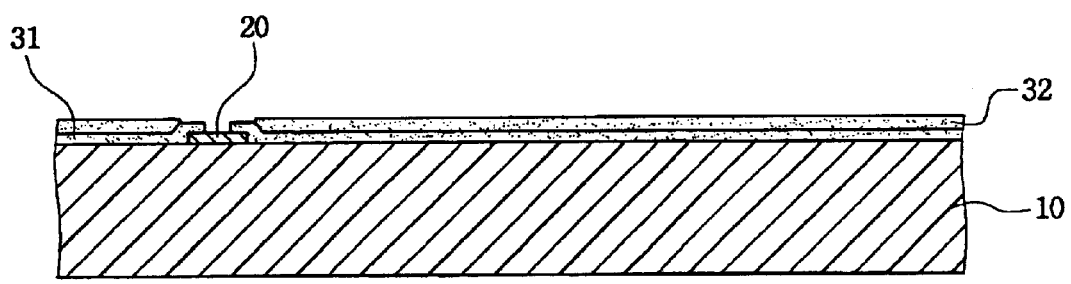
FIG. 4 illustrates the formation of an insulating layer on a surface of a semiconductor wafer in a method of manufacturing a wafer level package according to the present invention.

Package pattern 30 formed on the active surface of semiconductor chip 10 includes an insulating layer 28, metal wiring layer 34, second insulating layer 36, and connections 38. Insulating layer 28 is formed on the active surface of semiconductor chip 10 to expose electrode pads 20. Insulating layer 28 may be formed, for example, by applying a passivation layer 31 to the active surface of semiconductor chip 10 and then depositing first insulating layer 32 on passivation layer 31, as illustrated in FIGS. 3 and 4. Metal wiring layer 34 is formed on insulating layer 28 to be connected to exposed electrode pads 20, and a second insulating layer 36 is formed on metal wiring layer 34. Connections 38 are, for example, solder ball connections which are electrically connected with the metal wiring layer 34.

Insulating layer 28 and second insulating layer 36 are formed, for example, from a polymer-based insulating material. Metal wiring layer 34 is, for example, a Cu metal layer. Metal wiring layer 34 can be formed by sputtering-depositing titanium metal on insulating layer 28, then sputtering-depositing Cu metal, and then sputtering-depositing Cu and titanium metal again. FIG. 1 shows metal wiring layer 34 as a single layer, although it is possible that metal wiring layer 34 include several layers, for example, signal transmissions wiring layers and power supply wiring layers. As explained above, additional layers on the wafer may include, for example, passivation layers (shown in FIG. 3) deposited on the wafer surface formed under insulating layer 28 during the general wafer fabrication process.

As shown in FIG. 1, package body 50 does not increase the height of wafer level package 100. Package body 50 has a height which extends from the bottom surface 26 of semiconductor chip 10 to second insulating layer 36 of package pattern 30. Package body 50 is made from, for example, an epoxy molded resin used in the manufacturing of general plastic packages. The thickness of the semiconductor chip 10 after undergoing the wafer back lapping process is about 100–150 μm.

Figure 2:
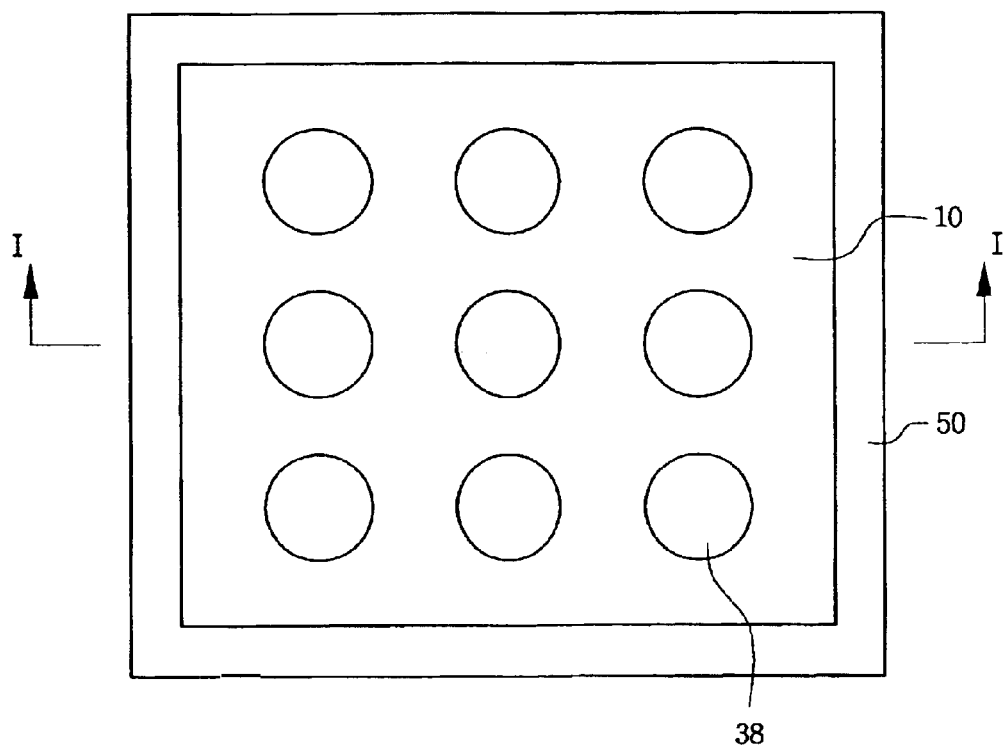
FIG. 2 is a plan view showing a wafer level package according to the present invention.

FIG. 2 illustrates a top plan view of a package body according an embodiment of the present invention. As shown in FIG. 2, package body 50 is formed on all sides of semiconductor chip 10, thus, protecting the side surfaces of semiconductor chip 10.

Figures FIG. 3 through FIG. 12 describe a method of manufacturing the wafer level package according an embodiment of the present invention. More specifically, figures FIG. 3 through FIG. 8 illustrate steps of forming the package patterns in the semiconductor chips as they exist in the wafer state, while figures FIG. 9 through FIG. 12 illustrate a die bonding process, according to an embodiment of the present invention.

Referring to FIG. 3, a passivation layer 31, which is generally applied to the semiconductor chip during the fabrication process, is deposited on the active surface of semiconductor chip 10 to form opening 33 to electrode pads 20. Passivation layer 31 is formed by etching, for example, Photo-Silicate Glass (PSG) film or film including SiO2 and Si3N4 as the main components by chemical vapor deposition (CVD).

Turning now to FIG. 4, first insulating layer 32 is deposited on passivation layer 31 and etching is used to form opening 33 first insulating layer 32. First insulating layer 32 is, for example, a dielectric layer of polyimide-based.

Figure 5:
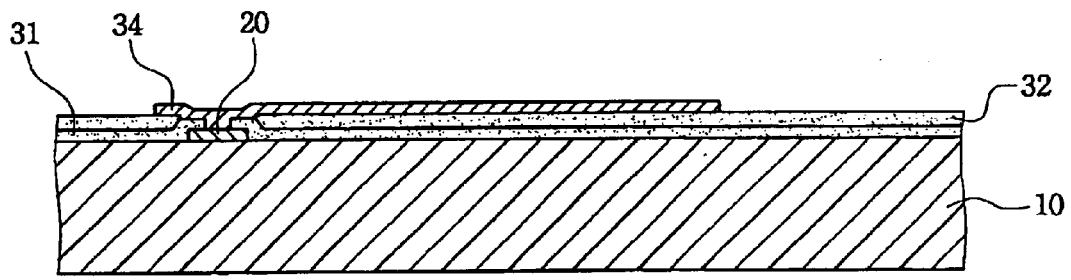
FIG. 5 illustrates the formation of a metal layer on the surface of the wafer provided with the insulating layer in a method of manufacturing a wafer level package according to the present invention.

FIG. 5 illustrates the formation of a metal layer in a method of manufacturing a wafer level according to an embodiment of the present invention. The metal layer, Cu for example, is deposited onto first insulating layer 32 and is photo-etched, thereby forming metal wiring layer 34. Metal wiring layer 34 contacts electrode pad 20 through opening 33. Wiring layer 34 may be formed, for example, by sputtering-depositing titanium metal on first insulating layer 32, then sputtering-depositing Cu metal, and then sputtering-depositing titanium metal again. Alternatively, wiring layer 34 may be formed, for example, by sputtering-depositing Cr metal on first insulating layer 32, then sputtering-depositing Cu metal, and sputtering-depositing Ni metal. Cr provides a strong attachment with first insulating layer 32 and provides barrier functions for electrode pads 20. Additionally, Ni has solder barrier function for solder balls and prevents oxidization.

Figure 6:
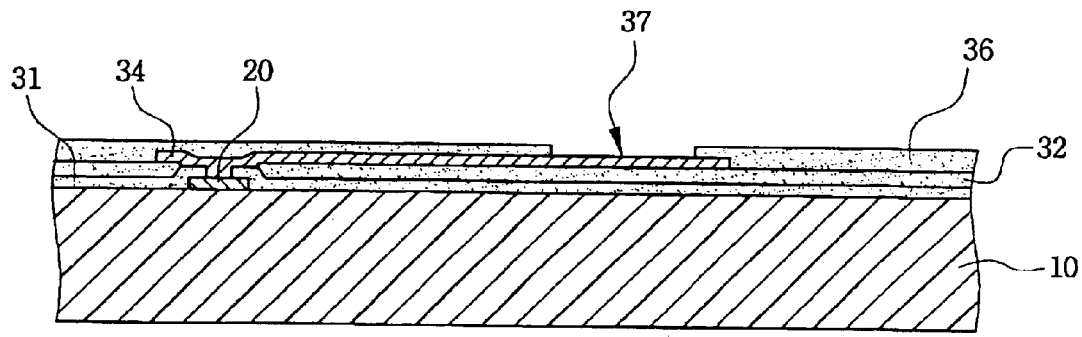
FIG. 6 illustrates the formation of a connection area on the surface of the wafer provided with the metal layer in a method of manufacturing a wafer level package according to the present invention.

Referring now to FIG. 6, second insulating layer 36 is deposited on metal wiring layer 34 and opening 37 is formed by the etching process.

For wafer level packages in which the metal wiring layer includes several layers, the steps of forming the first insulating layer, the metal wiring layer, and the second insulating layer are repeated as needed.

Figure 7:
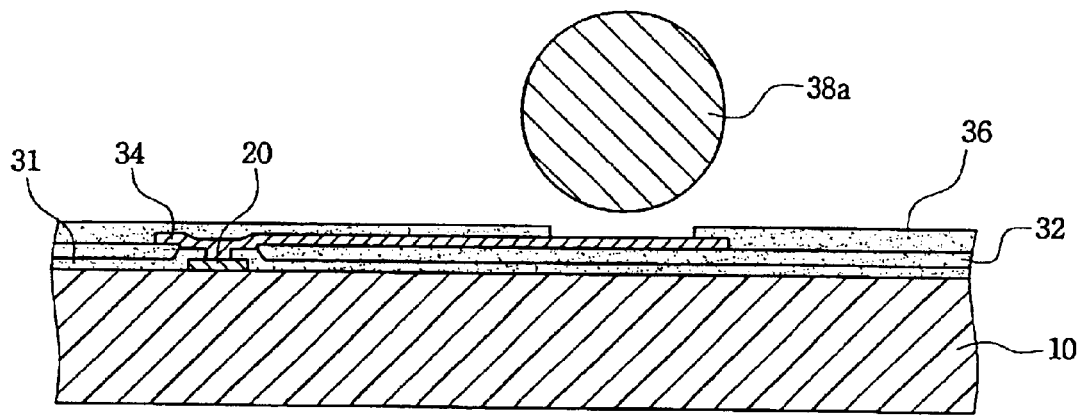
FIG. 7 illustrates the alignment of a solder ball on a semiconductor wafer in a method of manufacturing a wafer level package according to the present invention.
Figure 8:
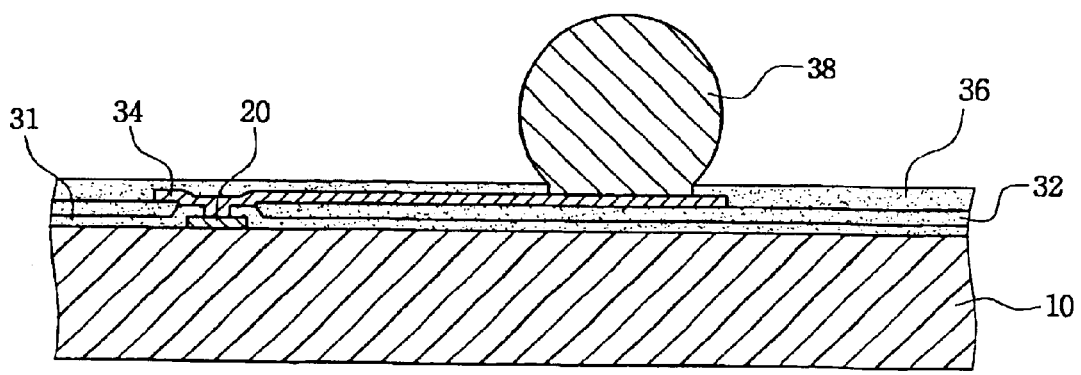
FIG. 8 illustrates the formation of a connection on the semiconductor wafer in a method of manufacturing a wafer level package according to the present invention.

As shown in figures FIG. 7 and FIG. 8, solder ball 38a is positioned over opening 37 of semiconductor chip 10 and heated by reflow soldering. As solder ball 38a is heated, solder ball 38a melts and connects with metal wiring layer 34 to form electric connections 38.

Once the wafer fabrication process for forming package pattern 30 in each of the semiconductor chips 10 of the wafer is complete, the electrical characteristics of the semiconductor chips of the wafer are tested. Following these tests, the electrical die sorting (EDS) process is performed. During the EDS process, chips which have failed the electrical tests and which are not repairable are marked by, for example, inking the surfaces of the chip that are impossible to repair. The unmarked chips are then separated from the wafer by the wafer sawing process and attached to the substrate of high-density mounting package. This process is referred to as die bonding.

Figure 9:
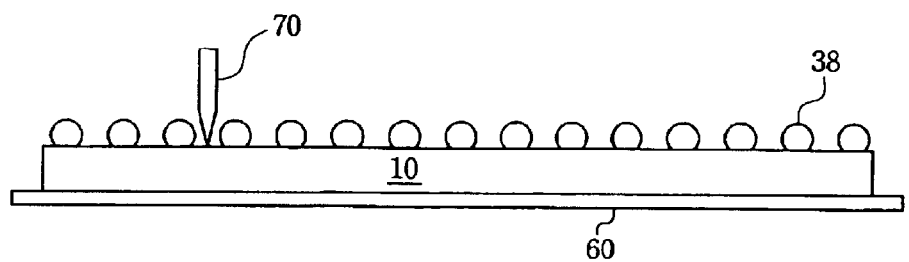
FIG. 9 illustrates the sawing of the semiconductor wafer in a method of manufacturing a wafer level package according to the present invention.

FIG. 9 illustrates the sawing of a semiconductor wafer according to an embodiment of the present invention. Initially, a tape 60 is attached to the bottom surface of semiconductor chip 10. Tape 60 is an expandable tape generally used in the wafer sawing process. Next, wafer sawing device 70 saws the wafer. Wafer sawing device 70 is, for example, a rotating diamond wheel or a laser. To support the wafer during this sawing process, the wafer is fixed on a vacuum chuck (not shown) by applying suction from the vacuum chuck to the bottom surface of the wafer. When the wafer sawing equipment (not shown) is aligned with the wafer, the wafer is sawed into individual chips by wafer sawing device 70. Tape 60 is not sawed.

Figure 10:
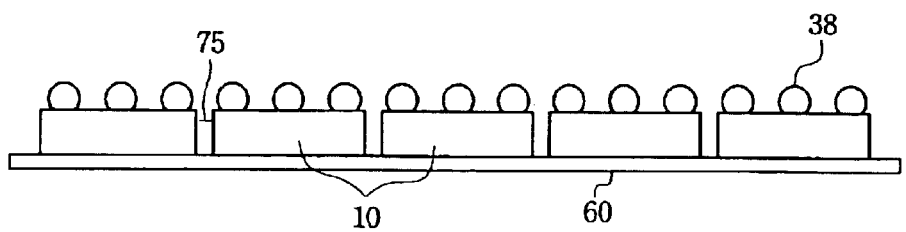
FIG. 10 illustrates the separation of the semiconductor wafer into the individual chips by the first sawing step, spacing apart-predetermined spaces between them in a method of manufacturing a wafer level package according to the present invention.

Referring now to FIG. 10, once the first wafer sawing process is complete, the wafer has been separated into individual semiconductor chips 10. However, because each semiconductor chip 1 0 remains attached to tape 60, the semiconductor chips remain in the shape of a wafer. Additionally, both sides of tape 60 attached to the bottom surface of the wafer extend beyond the sides of each individual semiconductor chip 10 and the individual chips are separated from one another by a distance designated by space 75. Although the size of space 75 differs based on the type of the semiconductor IC device formed on the wafer, it is preferable to set it 600 μm or less depending on the size of the test socket used to test the semiconductor IC device.

Figure 11:
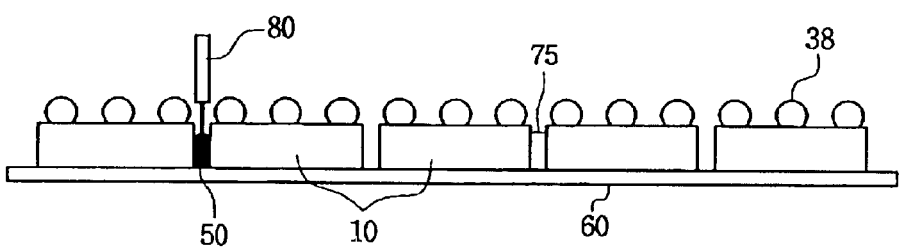
FIG. 11 illustrates the formation of package bodies in side surfaces of the individual chips of the wafer state in a method of manufacturing a wafer level package according to the present invention.

FIG. 11 illustrates the formation of package bodies according to an embodiment of the present invention. Package body 50 is formed by potting an epoxy molded resin in spaces 75 through, for example, a needle 80. The potted molded resin hardens thus forming package bodies 50 on the side surfaces of individual semiconductor chips 10.

Figure 12:
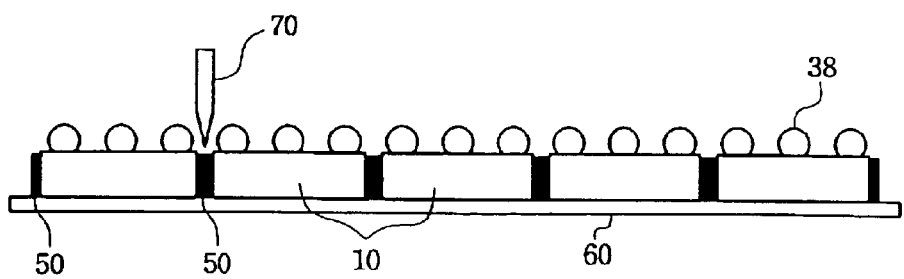
FIG. 12 illustrates the separation of the semiconductor wafer into individual chips in a method of manufacturing a wafer level package according to the present invention.

FIG. 12 illustrates the complete separation of the individual semiconductor chips 10. The individual semiconductor chips 10, still attached to tape 60, are mounted to the sawing equipment as described with reference to FIG. 9, and are separated by into individual semiconductor chips 10 by sawing through a portion of the package bodies 50 with sawing device 70. Sawing device 70 of this separation step is similar to sawing device 70 used in the first separation step.

Because individual semiconductor chips 10 are separated by sawing through package bodies 50 with sawing device 70, the damage to individual chips by sawing device 70 is reduced. Additionally, when sawing device is a rotating diamond wheel, the impact of the wheel is absorbed by package bodies 50.

Although the invention has been described with reference to particular embodiments, the description is only an example of the inventor's application and should not be taken as limiting. Various adaptations and combinations of features of the embodiments disclosed are within the scope of the invention as defined by the following claims.

What is claimed is:

1. A method of manufacturing a wafer level package comprising:

forming a semiconductor wafer, wherein the semiconductor wafer includes a plurality of semiconductor chips, wherein each semiconductor chip of the plurality of semiconductor chips includes a plurality of electrode pads;

creating a gap between each said semiconductor chip of the plurality of semiconductor chips such that each said semiconductor chip is separate from each other;

providing a package material only to each said gap to form a package body on vertical sides of each semiconductor chip of the plurality of semiconductor chips.

2. The method of claim 1, wherein forming the wafer further comprises:

forming a first insulating layer on the semiconductor wafer; and exposing the plurality of electrode pads.

3. The method of claim 2, wherein forming the first insulating layer on the semiconductor wafer comprises:

forming a passivation layer on the semiconductor wafer; and forming the first insulating layer on the passivation layer.

4. The method of claim 2, wherein forming the wafer further comprises:

forming a metal wiring layer on the first insulating layer, wherein the metal wiring layer is electrically connected to the electrode pads.

5. The method of claim 4, wherein forming the wafer further comprises:

forming a second insulating layer on the metal wiring layer; and providing openings in the metal wiring layer.

6. The method of claim 5, wherein forming the wafer further comprises:

forming an electrical connection on the metal wiring layer through the opening.

7. The method of claim 1, wherein the package material is a molded resin.

8. The method of claim 2, further comprising: separating the wafer into a plurality of separate semiconductor chips.

9. The method of claim 8, wherein separating the wafer comprises:

cutting the package body.

10. The method of claim 9, wherein cutting the package body comprises:

cutting the package body with a rotating cutting blade.

11. The method of claim 1, further comprising attaching a tape to a bottom surface of each said semiconductor chip.

12. The method of claim 11, wherein the tape is an expandable tape.

13. The method of claim 1, wherein the wafer level package includes a semiconductor chip from the plurality of semiconductor chips, wherein the plurality of electrode pads are positioned on an active surface of the semiconductor chip; and the package body formed on the sides of the semiconductor chip.

* * * * *